United States Patent
Ahmed et al.

(10) Patent No.: US 9,837,966 B1
(45) Date of Patent: Dec. 5, 2017

(54) SERIES-TYPE DOHERTY AMPLIFIER

(71) Applicant: FREESCALE SEMICONDUCTOR, INC., Austin, TX (US)

(72) Inventors: Abdulrhman M. S. Ahmed, Gilbert, AZ (US); Joseph Staudinger, Gilbert, AZ (US); Ebrahim Al Seragi, Mesa, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/248,825

(22) Filed: Aug. 26, 2016

(51) Int. Cl.
*H03F 1/02* (2006.01)
*H03F 3/21* (2006.01)
*H03F 3/19* (2006.01)

(52) U.S. Cl.
CPC .............. *H03F 1/0288* (2013.01); *H03F 3/19* (2013.01); *H03F 3/21* (2013.01); *H03F 2200/336* (2013.01); *H03F 2200/451* (2013.01)

(58) Field of Classification Search
CPC ......... H03F 1/0288; H03F 1/07; H03F 1/3252
USPC .............................................. 330/295, 124 R
See application file for complete search history.

(56) References Cited

U.S. PATENT DOCUMENTS

| | | | | |
|---|---|---|---|---|
| 6,452,446 B1 * | 9/2002 | Eisenberg | ............. | H03F 1/3235 330/149 |
| 7,164,316 B2 | 1/2007 | Kim et al. | | |
| 7,301,397 B2 * | 11/2007 | Arbab | ...................... | H03F 1/32 330/149 |
| 7,679,440 B2 * | 3/2010 | Ishigami | ............... | H03F 1/3229 330/149 |
| 8,988,147 B2 | 3/2015 | Liu | | |
| 9,024,690 B2 * | 5/2015 | Widdowson | .......... | H03F 1/3205 330/124 R |
| 9,219,453 B2 | 12/2015 | Ahmed et al. | | |
| 9,225,291 B2 | 12/2015 | Ahmed et al. | | |
| 9,577,586 B1 * | 2/2017 | Uzunoglu | ............. | H03F 1/0288 |
| 2002/0084845 A1 * | 7/2002 | Eisenberg | ............. | H03F 1/3235 330/52 |
| 2002/0125948 A1 * | 9/2002 | Haigh | ................... | H03F 1/3223 330/151 |

(Continued)

OTHER PUBLICATIONS

Koo, C. et al., "A Linearity-Enhanced Compact Series-Type Doherty Amplifier Suitable for CDMA Handset Applications", 2007 IEEE Radio and Wireless Symposium, pp. 317-320.

(Continued)

*Primary Examiner* — Henry Choe
(74) *Attorney, Agent, or Firm* — Daniel D. Hill

(57) ABSTRACT

A series-type Doherty amplifier circuit includes a first amplifier, a second amplifier, and a directional coupler. The first amplifier is of a first type and has an input for receiving a radio frequency input signal, and an output. The second amplifier is of a second type and has an input and an output. The directional coupler has a first terminal coupled to the output of the first amplifier, a second terminal coupled to the input of the second amplifier, and a third terminal coupled to the output of the second amplifier for providing a radio frequency output signal. The series-type Doherty amplifier circuit may also include variable phase and attenuation circuits for adjusting the phase and attenuation of input signal for the second amplifier. The ability to adjust phase and attenuation allows high operating efficiency for any saturation power level.

16 Claims, 8 Drawing Sheets

(56) References Cited

U.S. PATENT DOCUMENTS

2006/0238246 A1* 10/2006 Ishigami ............... H03F 1/3223
330/151
2015/0349720 A1    12/2015 Staudinger et al.
2016/0094187 A1    3/2016 Staudinger et al.

OTHER PUBLICATIONS

Jung, J. et al., "A New 'Series-Type' Doherty Amplifier for Miniaturization, 2005 Radio Frequency Integrated Circuits (RFIC) Symposium", pp. 259-262.
Koo, C. et al., "Fully Integrated HBT MMIC Series-Type Extended Doherty Amplifier for W-CDMA Handset Applications", ETRI Journal, vol. 32, No. 1, Feb. 2010, pp. 151-153.

* cited by examiner

US 9,837,966 B1

SERIES-TYPE DOHERTY AMPLIFIER

BACKGROUND

Field

This disclosure relates generally to electronic circuits and more specifically to a series-type Doherty amplifier.

Related Art

Doherty amplifiers are commonly used in wireless communications systems. Doherty amplifiers include two amplifiers operating in different classes, a carrier amplifier and a peaking amplifier. The carrier amplifier is a class AB amplifier and the peaking amplifier is a class C amplifier. Two common configurations of the Doherty amplifier is the parallel-type and the series-type. FIG. 1 illustrates a prior art parallel-type Doherty amplifier 10 having a carrier amplifier 12 and a peaking amplifier 14 arranged in a parallel configuration. A radio frequency (RF) input signal RF IN is split between two parallel paths using a splitter 16. One parallel path has carrier amplifier 12 and 90-degree phase shifter 20 and the other parallel path has a 90-degree phase shifter 18 and peaking amplifier 14. The two parallel paths come together at the output of peaking amplifier 14 to generate an RF output signal RF OUT. FIG. 2 illustrates a prior art series-type Doherty amplifier 22 having a carrier amplifier 24 and a peaking amplifier 32 arranged in a series configuration. The output of carrier amplifier 24 is split between the input of peaking amplifier 32 and an output terminal of Doherty amplifier 22 using splitter 26. Ninety-degree phase shifters 28 and 30 are connected to each output of splitter 26. Series-type Doherty amplifier 22 can potentially provide better performance than parallel-type Doherty amplifier 10. However, both prior art Doherty amplifiers 10 and 22 have limitations in their structure that limit performance factors such as gain and isolation. Therefore, a need exists for a series-type Doherty amplifier that provides better performance.

BRIEF DESCRIPTION OF THE DRAWINGS

The present invention is illustrated by way of example and is not limited by the accompanying figures, in which like references indicate the same or similar elements between the various embodiments. Elements in the figures are illustrated for simplicity and clarity and have not necessarily been drawn to scale.

DETAILED DESCRIPTION

Figure 1:
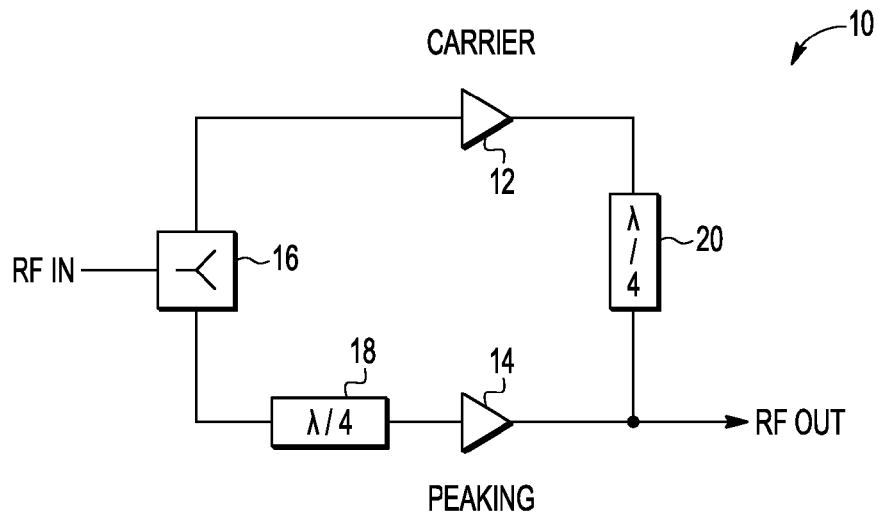
FIG. 1 illustrates a parallel-type Doherty amplifier in accordance with the prior art.

Generally, there is provided, a Doherty amplifier having a carrier amplifier and a peaking amplifier coupled in series. A directional coupler is used to couple the output of the carrier amplifier to the input of the peaking amplifier. The use of a directional coupler instead of a splitter provides higher gain and enhances isolation between the output of the carrier amplifier and the output of the peaking amplifier. In one embodiment, a variable phase shifter and variable attenuator are coupled between the directional coupler and the input of the peaking amplifier to adjust the phase and attenuation in response to changes in saturation power. This allows the Doherty amplifier to be adjusted for different applications. In another embodiment, the phase and attenuation may be adjusted dynamically in response to an in-phase and quadrature signal on the input side of the Doherty amplifier.

In one embodiment, there is provided, an amplifier circuit, comprising: a first amplifier of a first type having an input for receiving a radio frequency input signal, and an output; a second amplifier of a second type having an input and an output; and a directional coupler having a first terminal coupled to the output of the first amplifier, a second terminal coupled to the input of the second amplifier, and a third terminal coupled to the output of the second amplifier for providing a radio frequency output signal. The first type may be characterized as being class AB and the second type may be characterized as being claim C. The amplifier circuit may be characterized as being a Doherty amplifier, the first amplifier may be a carrier amplifier, and the second amplifier may be a peaking amplifier. The directional coupler may further comprise a fourth terminal coupled to ground through a resistive element. The amplifier circuit may further comprise a variable phase shifter and a variable attenuator coupled together in series between the second terminal of the directional coupler and the input of the second amplifier. The amplifier circuit may further comprise a controller to adjust the variable phase shifter and variable attenuator based on in phase and quadrature input signals, wherein the in phase and quadrature input signals are combined to generate the radio frequency input signal. The controller may comprise: an absolute value circuit arranged to determine an amplitude of the in phase and quadrature input signals and provide an adjustment signal to control the variable attenuator; and a shaping circuit arranged to determine the phase of the in phase and quadrature input signals and control a phase shift of the variable phase shifter. The controller may cause the second amplifier to turn on after determining that the first amplifier is in saturation. The amplifier circuit may further comprise a third amplifier coupled between the second terminal of the directional coupler and the input of the second amplifier.

In another embodiment, there is provided, an amplifier circuit, comprising: a first amplifier of a first type having an input for receiving a radio frequency input signal, and an output; a variable phase shifter and a variable attenuator coupled together in series to the output terminal of the first amplifier; and a second amplifier of a second type having an input coupled to the variable phase shifter and the variable attenuator, and an output for providing a radio frequency output signal. The amplifier circuit may further comprise a phase shifter having an input coupled to the output of the first amplifier, and an output coupled to the output of the second amplifier. The amplifier circuit may further comprise a directional coupler having a first terminal coupled to the output of the first amplifier, a second terminal coupled to the input of the second amplifier, and a third terminal coupled to the output of the second amplifier. The first type may be characterized as being class AB and the second type may be characterized as being claim C. The amplifier circuit may be characterized as being a Doherty amplifier, the first amplifier may be a carrier amplifier, and the second amplifier may be a peaking amplifier. The directional coupler may further comprise a fourth terminal coupled to ground through a resistive element. The amplifier circuit may further comprise a controller to adjust the variable phase shifter and variable attenuator based on in phase and quadrature input signals, wherein the in phase and quadrature input signals may be combined to generate the radio frequency input signal, the controller may comprise: an absolute value circuit arranged to determine an amplitude of the in phase and quadrature input signals and providing an adjustment signal to control the variable attenuator; and a shaping circuit arranged to determine the phase of the in phase and quadrature input signals and controlling a phase shift of the variable phase shifter.

In yet another embodiment, there is provided, an amplifier circuit, comprising: a first amplifier of a first type having an input for receiving a radio frequency input signal, and an output; a second amplifier of a second type having an input, and an output for providing a radio frequency output signal; a directional coupler having a first terminal coupled to the output of the first amplifier, a second terminal coupled to the input of the second amplifier, and a third terminal coupled to the output of the second amplifier for providing a radio frequency output signal; a variable phase shifter and a variable attenuator coupled together in series between the second terminal of the directional coupler and the input of the second amplifier; and a controller to adjust the variable phase shifter and variable attenuator based on in-phase and quadrature input signals, wherein the in-phase and quadrature input signals are combined to generate the radio frequency input signal. The amplifier circuit may be characterized as being a Doherty amplifier, the first amplifier may be a carrier amplifier, and the second amplifier may be a peaking amplifier. The directional coupler may further comprise a fourth terminal coupled to ground through a resistive element. The controller may comprise: an absolute value circuit arranged to determine an amplitude of the in phase and quadrature input signals and providing an adjustment signal to control the variable attenuator; and a shaping circuit arranged to determine the phase of the in phase and quadrature input signals and controlling a phase shift of the variable phase shifter.

Figure 3:
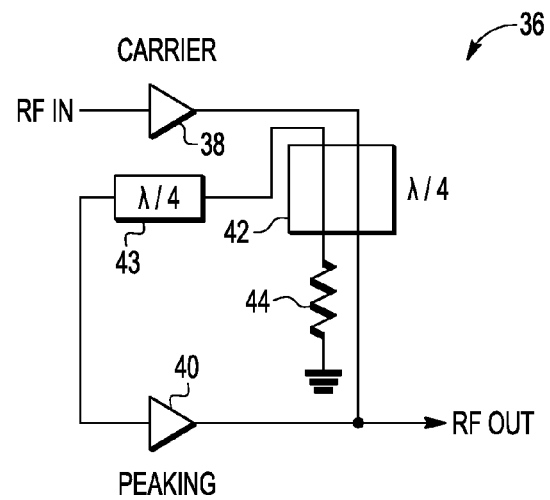
FIG. 3 illustrates a series-type Doherty amplifier in accordance with an embodiment.

FIG. 3 illustrates series-type Doherty amplifier 36 in accordance with an embodiment. Doherty amplifier 36 includes carrier amplifier 38, peaking amplifier 40, directional coupler 42, 90 degree phase shifter ($\lambda/4$) 43, and resistive element 44. Carrier amplifier 38 has an input coupled to receive radio frequency (RF) input signal RF IN, and an output. Peaking amplifier 40 as an input terminal, and an output terminal for providing an RF output signal labeled RF OUT. Directional coupler 42 has four terminals. A first terminal of directional coupler 42 is connected to the output terminal of carrier amplifier 38, a second terminal is connected to the input terminal of peaking amplifier 40 through 90 degree phase shifter 43, a third terminal is connected to the output terminal of peaking amplifier 40, and a fourth terminal is connected to a first terminal of resistive element 44. A second terminal of resistive element 44 is connected to ground.

Figure 2:
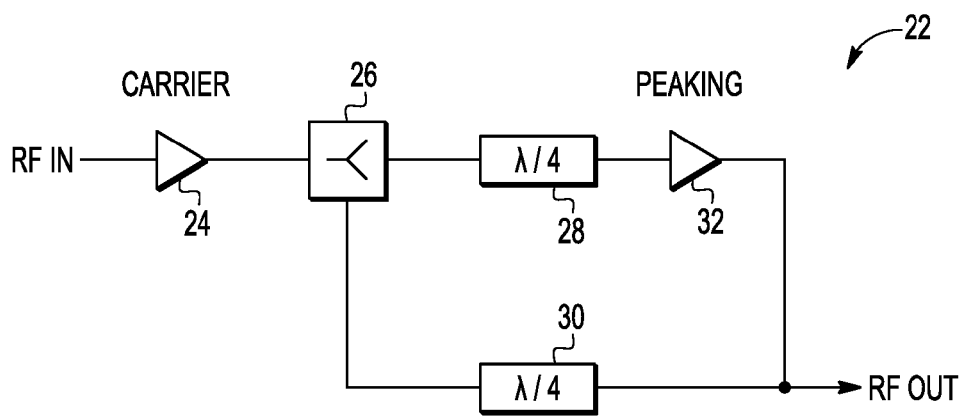
FIG. 2 illustrates a series-type Doherty amplifier in accordance with the prior art.

Generally, the carrier and peaking amplifiers of a Doherty power amplifier operate in different amplification classes. In Doherty amplifier 36, carrier amplifier 38 operates in class AB and peaking amplifier 40 operates in class C. At lower power settings, only carrier amplifier 38 is on. When saturation power is reached, peaking amplifier 40 turns on. Carrier amplifier 38 may function as a driver for peaking amplifier 40 when peaking amplifier 40 turns on. Directional coupler 42 has a 90-degree phase shifter ($\lambda/4$) built-in. Directional coupler 42 is used as a power divider in place of the splitter used in the prior art series-type Doherty amplifier of FIG. 2. A directional coupler generally includes two parallel conductors set close together so that energy is coupled from one conductor to the other. The parallel conductors may be formed from traces or transmission lines on a printed circuit board. The amount of power coupling is determined by the length of the parallel line segments and the proximity of the parallel lines to each other. In one embodiment, the parallel portion is 16 millimeters long. In another embodiment, the length of the parallel portion may be different. A characteristic impedance is chosen to match the transmission line impedance, for example, 50 ohms. Resistor 44 functions as a load for directional coupler 42. As shown in FIG. 3, the signal provided through directional coupler 42 to the output is larger than the signal provided to the input of peaking amplifier 40. The use of directional coupler 42 in Doherty amplifier 36 provides higher gain, better isolation, and higher efficiency than a splitter as illustrated in prior art FIG. 2.

Figure 4:
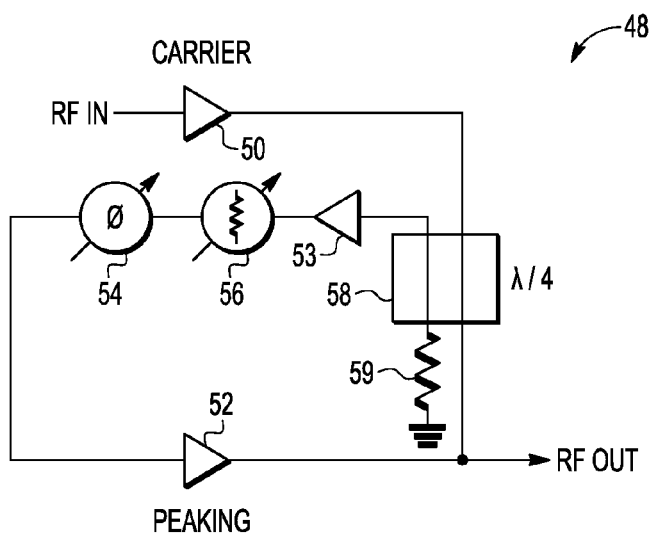
FIG. 4 illustrates a series-type Doherty amplifier in accordance with another embodiment.

FIG. 4 illustrates series-type Doherty amplifier 48 in accordance with another embodiment. Doherty amplifier 48 includes carrier amplifier 50, peaking amplifier 52, amplifier 53, variable phase shifter 54, variable attenuator 56, and directional coupler 58. Carrier amplifier 50 has an input for receiving RF input signal RF IN, and an output. Directional coupler 58 has a first terminal connected to the output of carrier amplifier 50, a second terminal, a third terminal, and a fourth terminal. Directional coupler 58 provides a 90-degree phase shift to the output signal of carrier amplifier 50. Amplifier 53 has an input connected to the second terminal of directional coupler 58, and an output for providing an RF output signal RF OUT. Amplifier 53 may not be present in some embodiments of Doherty amplifier 48. Variable phase shifter 54 and variable attenuator 56 are connected in series between the second terminal of directional coupler 58 and an input of peaking amplifier 53. Variable attenuator 56 and variable phase shifter 54 can be coupled together in any order. In the illustrated embodiment, variable attenuator 56 has an input coupled to the output of amplifier 53, and an output. Variable phase shifter 54 has an input connected to the output of variable attenuator 56, and output. Peaking amplifier 52 has an input connected to the output of phase shifter 54, and an output connected to the third terminal of directional coupler 58. Resistive element 59 has a first terminal connected to the fourth terminal of directional coupler 58, and a second terminal connected to ground.

In Doherty amplifier 48, the phase and attenuation of the output of carrier amplifier 48 can be adjusted. For example, the phase and attenuation can be adjusted in discrete steps to fine-tune the signal provided through the third terminal of directional coupler 58. In addition, amplifier 53 can be used to provide a boosted signal strength for the input signal for peaking amplifier 52. The attenuation provided to the peaking amplifier input signal may be adjusted using variable attenuator 56. In one embodiment, an attenuation setting of variable attenuator 56 may be chosen in response to a comparison of the amplitude of carrier amplifier 50 and peaking amplifier 52. The phase shift may be adjusted in a similar manner. The use of variable attenuator 56 and variable phase shifter 54 may facilitate adjustment in the field. In one application, Doherty amplifier 48 may be used as a driver with higher gain and higher output power than a class AB amplifier. Certain values of phase and attenuation may be chosen to provide high saturation power and high efficiency. For the same amplifier in a different application, a different set of values may provide a lower saturation power with high efficiency. Also, the adjustability of phase and attenuation means higher efficiency can be had at backoff. Operation in backoff means that the PA's maximum output power level must be reduced so that the entire signal is within the linear region of the power amplifier (PA) transfer curve. Therefore, Doherty amplifier 48 provides flexibility for use in different applications.

Figure 5:
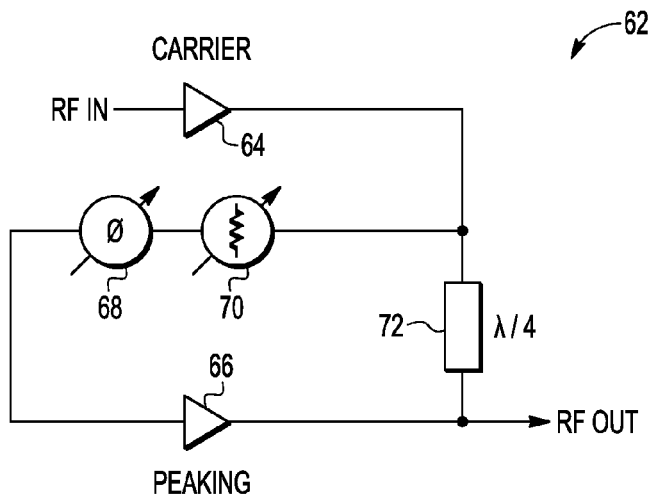
FIG. 5 illustrates a series-type Doherty amplifier in accordance with another embodiment.

FIG. 5 illustrates series-type Doherty amplifier 62 in accordance with another embodiment. Doherty amplifier 62 is similar to Doherty amplifier 48 except that Doherty amplifier 62 lacks a directional coupler between the output of carrier amplifier 64 and the input of peaking amplifier 66. Doherty amplifier 62 includes carrier amplifier 64, peaking amplifier 66, variable phase shifter 68, variable attenuator 70, and phase shifter 72. Carrier amplifier 64 has an input for receiving RF input RF IN, and an output. Variable attenuator 70 has an input connected to the output of carrier amplifier 64, and an output. Variable phase shifter 68 has an input connected to the output of variable attenuator 70. Note that variable phase shifter 68 and variable attenuator 70 can be connected together in any order. Peaking amplifier 66 has an input connected to the output of variable phase shifter 68, and an output for providing RF output signal RF OUT. Ninety-degree phase shifter 72 as an input connected to the output of carrier amplifier 64, and an output connected to the output of peaking amplifier 66.

Doherty amplifier 64 operates similar to Doherty amplifier 48, except Doherty amplifier 64 does not use a directional coupler. Variable phase shifter 68 and variable attenuator 70 provides adjustability to the input signal of peaking amplifier 66. Ninety-degree phase shifter 72 ($\lambda$/4) couples the output of carrier amplifier 64 to the output of Doherty amplifier 64. The input of peaking amplifier 66 may receive more of the output signal from carrier amplifier 64 than the embodiments of FIG. 3 and FIG. 4. If needed, an amplifier, such as amplifier 53 in FIG. 4 may be added in series with variable phase shifter 68 and variable attenuator 70.

Figure 6:
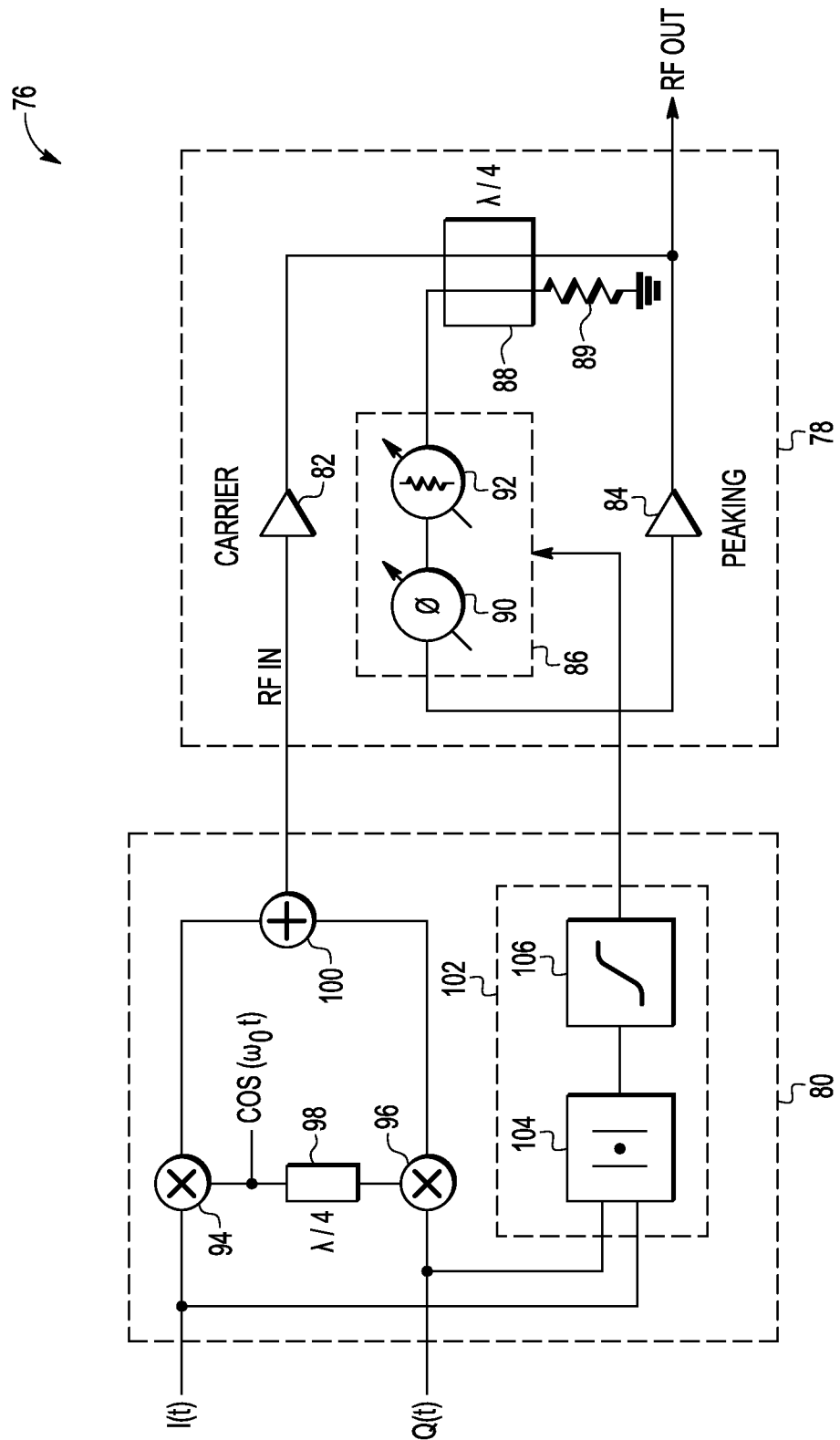
FIG. 6 illustrates a series-type Doherty amplifier in accordance with another embodiment.

FIG. 6 illustrates series-type Doherty amplifier 76 in accordance with another embodiment. Doherty amplifier 76 includes amplifier 78 and controller portion 80. Amplifier portion 78 includes carrier amplifier 82, peaking amplifier 84, directional coupler 88, phase/attenuation adjustment circuit 86, and resistive element 89. Phase/attenuation adjustment circuit 86 includes variable attenuator 92 and variable phase shifter 90. Controller portion 80 includes mixers 94 and 96, 90-degree phase shifter 98, summation element 100, and control circuit 102. Control circuit 102 includes absolute value circuit 104 and shaping circuit 106.

In amplifier portion 78, carrier amplifier 82 has an input for receiving RF input signal RF IN, and an output. Directional coupler 88 has a first terminal connected to the output of carrier amplifier 82, a second terminal connected to phase/attenuation adjustment circuit 86, a third terminal, and a fourth terminal. Variable attenuator 92 has an input connected to the second terminal of directional coupler 88, and an output. Variable phase shifter 90 has an input connected to the output of variable attenuator 92, and an output. Peaking amplifier 84 has an input connected to the output of variable phase shifter 90, and an output connected to the third terminal of directional coupler 88 for providing RF output signal RF OUT. Resistive element 89 has a first terminal connected to the fourth terminal of directional coupler 88, and a second terminal connected to ground.

Amplifier portion 78 operates similarly to amplifier 48 in FIG. 4 except that phase/attenuation adjustment circuit 86 is controlled dynamically and in real time by controller portion 80. That is, phase and attenuation are adjusted in real time as a function of the envelope frequency of the input signals I(t) and Q(t). In controller portion 80, mixer 94 has a first input for receiving an in-phase signal labeled I(t), a second input for receiving a modulation signal $\cos(\omega_o t)$, and an output. Mixer 96 has a first input for receiving a quadrature signal labeled Q(t), a second input for receiving modulation signal $\cos(\omega_o t)$ via 90-degree phase shift circuit 98 ($\lambda$/4), and an output. Summation circuit 100 has a first input connected to the output of mixer 94, a second input connected to the output of mixer 96, and an output for providing RF input signal RF IN. In another embodiment, amplifier portion 78 may include an amplifier, such as amplifier 53 (FIG. 4) in series with phase/attenuation adjustment circuit 86.

In control circuit 102, absolute value circuit 104 has an input for receiving in-phase and quadrature signals I(t) and Q(t), and an output. Shaping circuit 106 has an input connected to the output of absolute value circuit 104, and an output connected to phase/attenuation adjustment circuit 86. In one embodiment, the output of absolute value circuit 104 is provided to control variable attenuator 92, and the output of shaping circuit 106 is provided to control variable phase shifter 90.

Mixers 94 and 96 along with signal $\cos(\omega_o t)$ and 90-degree phase shifter provide an upsampling function for the in-phase and quadrature signals I(t) and Q(t). The upsampled in-phase and quadrature signals I(t) and Q(t) are combined by summation element 100 to generate radio frequency input signal RF IN. Absolute value circuit 104 determines the amplitude of the in-phase and quadrature signals I(t) and Q(t) (that is, the magnitude of I+jQ) and provides an adjustment signal to control variable attenuator 92. Shaping circuit 106 determines a phase relationship of the in-phase and quadrature signals I(t) and Q(t) and controls a phase shift of variable phase shifter 90. Phase/attenuation adjustment circuit 86 may be used to control when peaking amplifier 84 turns on. For example, it may be desirable for peaking amplifier 84 to turn on immediately after carrier amplifier 82 is in saturation. Carrier amplifier 82 may function as a driver for peaking amplifier 84 when peaking amplifier 84 turns on. As described above, directional coupler 88 is used as a power divider in place of a splitter. Resistor 89 functions as a load element for directional coupler 88. As shown in FIG. 6, the portion of the output signal from carrier amplifier 82 that is provided through directional coupler 88 to become output signal RF OUT is larger than the carrier amplifier output signal portion provided to the input of peaking amplifier 84.

Figure 7:
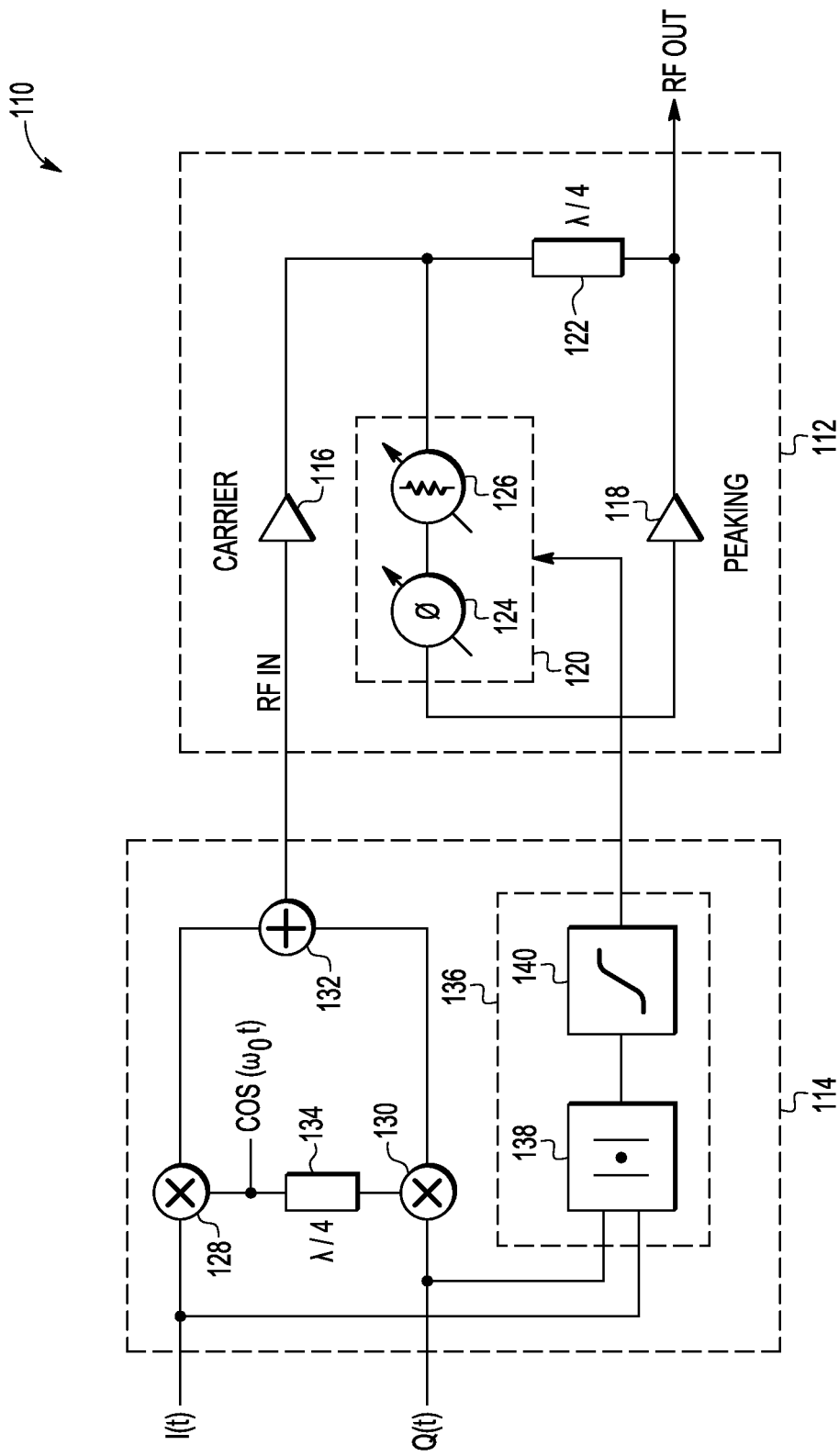
FIG. 7 illustrates a series-type Doherty amplifier in accordance with another embodiment.

FIG. 7 illustrates series-type Doherty amplifier 110 in accordance with another embodiment. Doherty amplifier 110 includes amplifier portion 112 and controller portion 114. Amplifier portion 112 includes carrier amplifier 116, peaking amplifier 118, 90-degree phase shifter 122 ($\lambda$/4), and phase/attenuation adjustment circuit 120. Phase/attenuation adjustment circuit 120 includes variable attenuator 126 and variable phase shifter 124. Controller portion 114 includes mixers 128 and 130, 90-degree phase shifter 134, summation element 132, and control circuit 136. Control circuit 136 includes absolute value circuit 138 and shaping circuit 140.

In amplifier portion 112, carrier amplifier 116 has an input for receiving RF input signal RF IN, and an output. Variable attenuator 126 has an input connected to the output of carrier amplifier 116. Variable phase shifter 124 has an input connected to the output of variable attenuator 126, and an output. Peaking amplifier 118 has an input connected to the output of variable phase shifter 124, and an output for providing RF output signal RF OUT. Ninety-degree phase shifter 122 has a first terminal connected to the output of carrier amplifier 116, and a second terminal connected to the output of peaking amplifier 118.

In controller portion 114, mixer 128 has a first input for receiving in-phase signal I(t), a second input for receiving modulation signal $\cos(\omega_o t)$, and an output. Mixer 130 has a first input for receiving quadrature signal Q(t), a second input for receiving modulation signal $\cos(\omega_o t)$ via 90-degree phase shift circuit 134, and an output. Summation circuit 132 has a first input connected to the output of mixer 128, a second input connected to the output of mixer 130, and an output for providing RF input signal RF IN.

In control circuit 136, absolute value circuit 138 has input for receiving in-phase and quadrature signals I(t) and Q(t), and an output. Shaping circuit 140 has an input connected to the output of absolute value circuit 136, and an output connected to phase/attenuation adjustment circuit 120. In one embodiment, the output of absolute value circuit 138 is provided to control variable attenuator 126, and the output of shaping circuit 140 is provided to control variable phase shifter 124.

In FIG. 7, controller portion 114 operates similarly to controller portion 80 in FIG. 6. Amplifier portion 112 operates similarly to amplifier 62 in FIG. 5.

Figure 8:
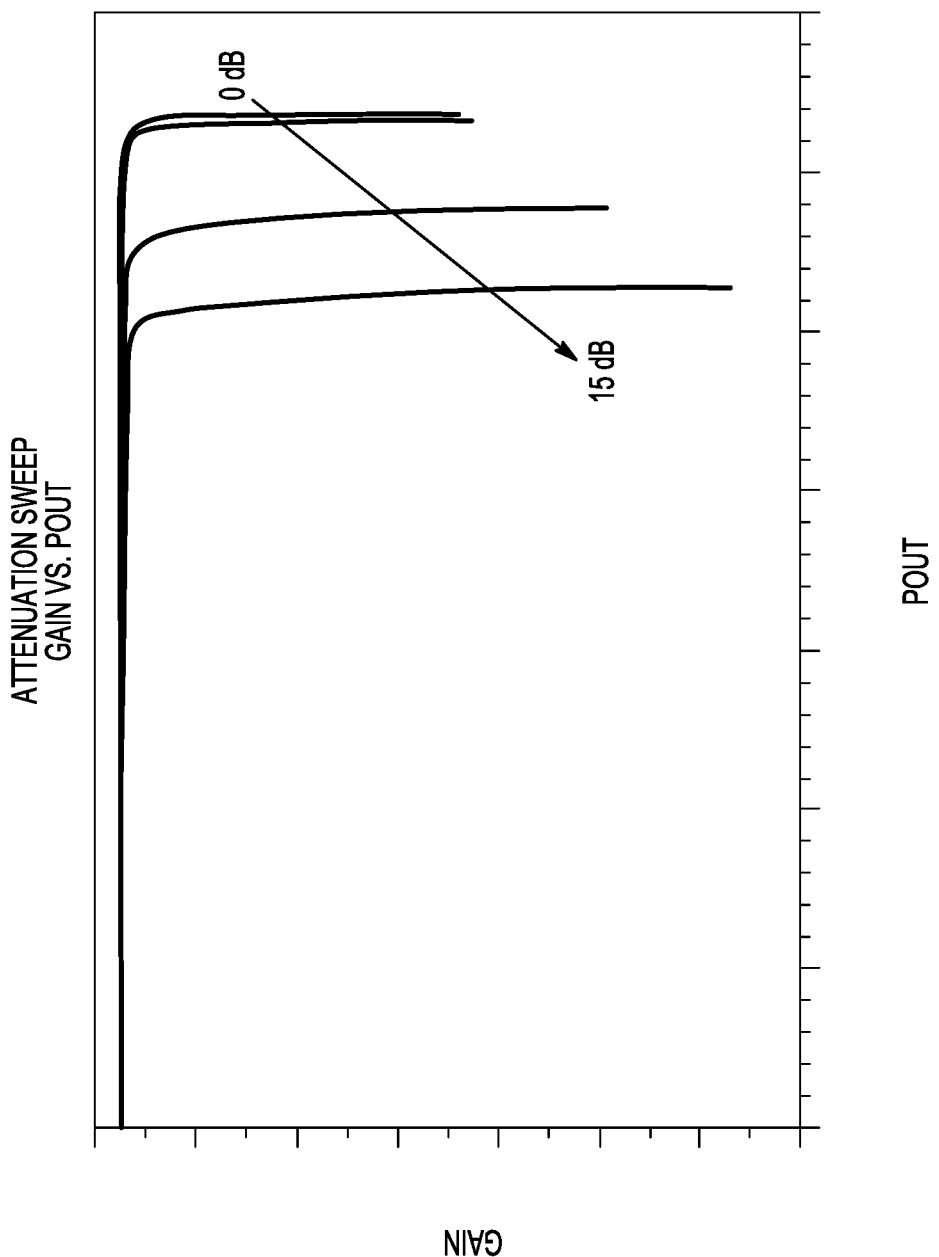
FIG. 8 illustrates a plot of gain vs output power for different attenuator values for the embodiment of FIG. 6.
Figure 9:
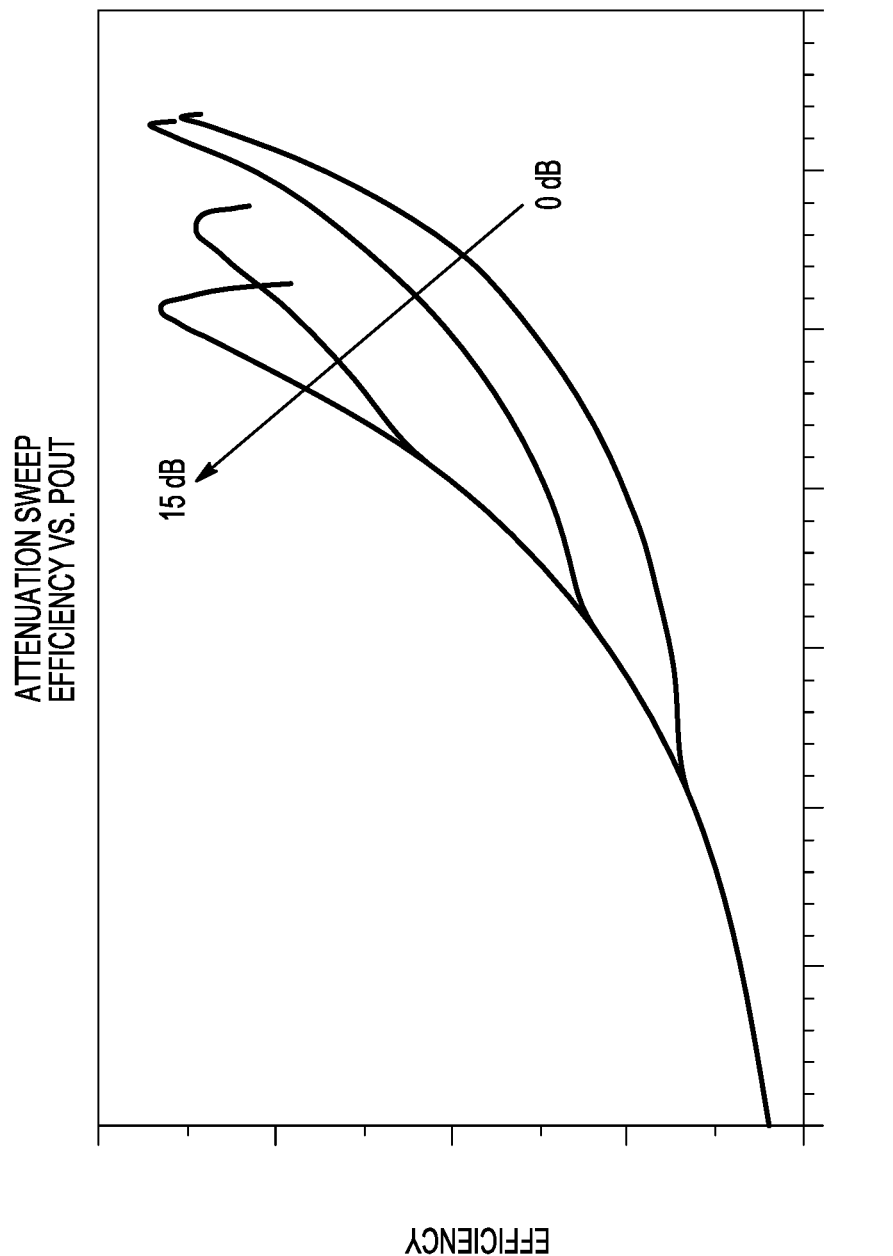
FIG. 9 illustrates a plot of efficiency vs output power for different attenuator values for the embodiment of FIG. 6.

FIGS. 8 and 9 show how gain and efficiency change by sweeping various attenuator values of variable attenuator 92. FIG. 8 illustrates a plot of gain vs output power POUT for various attenuator settings for the embodiment of FIG. 6 from about 0 dB to about 15 dB. Gain is plotted on the vertical axis versus POUT on the horizontal axis. FIG. 9 illustrates a plot of efficiency vs output power POUT for various different attenuator values for the embodiment of FIG. 6 from about 0 dB to about 15 dB. Efficiency is plotted on the vertical axis versus POUT on the horizontal axis.

Figure 10:
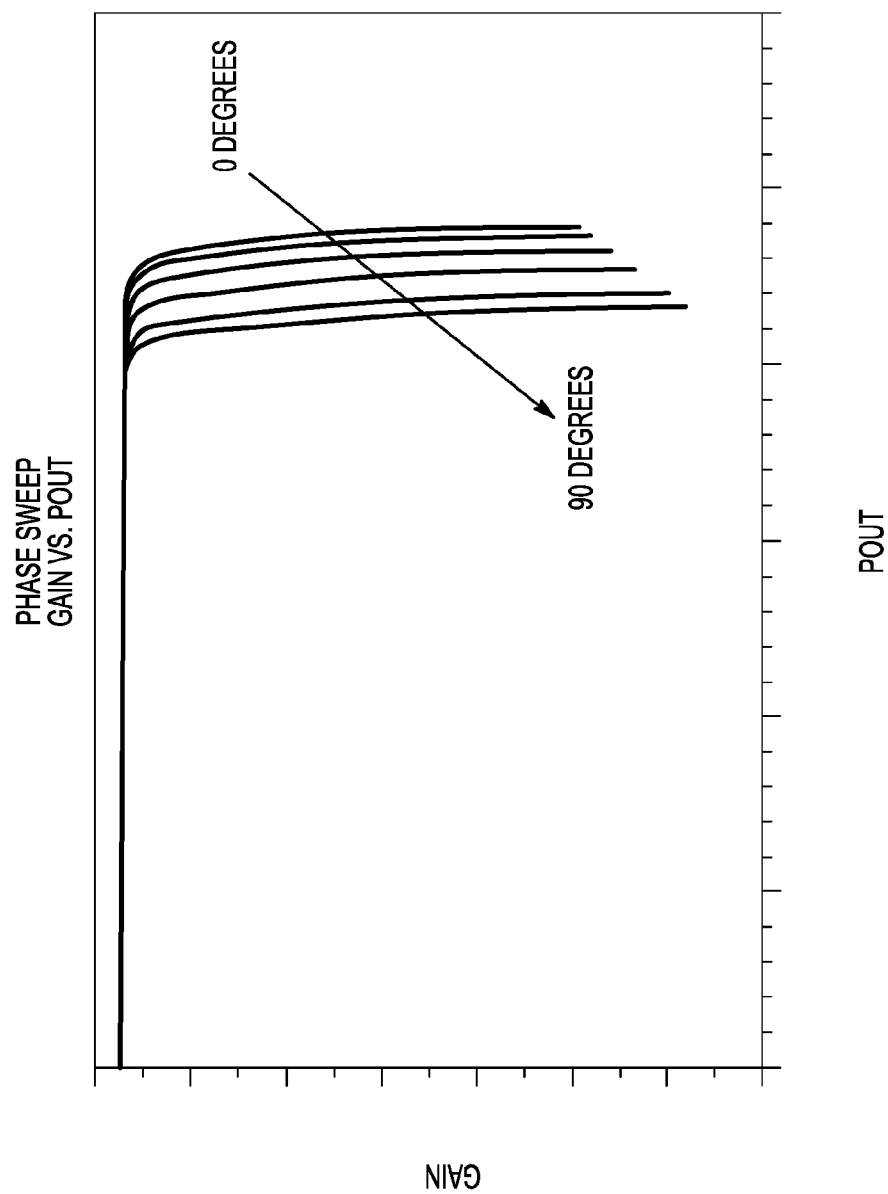
FIG. 10 illustrates a plot of gain vs output power for different phase values for the embodiment of FIG. 6.
Figure 11:
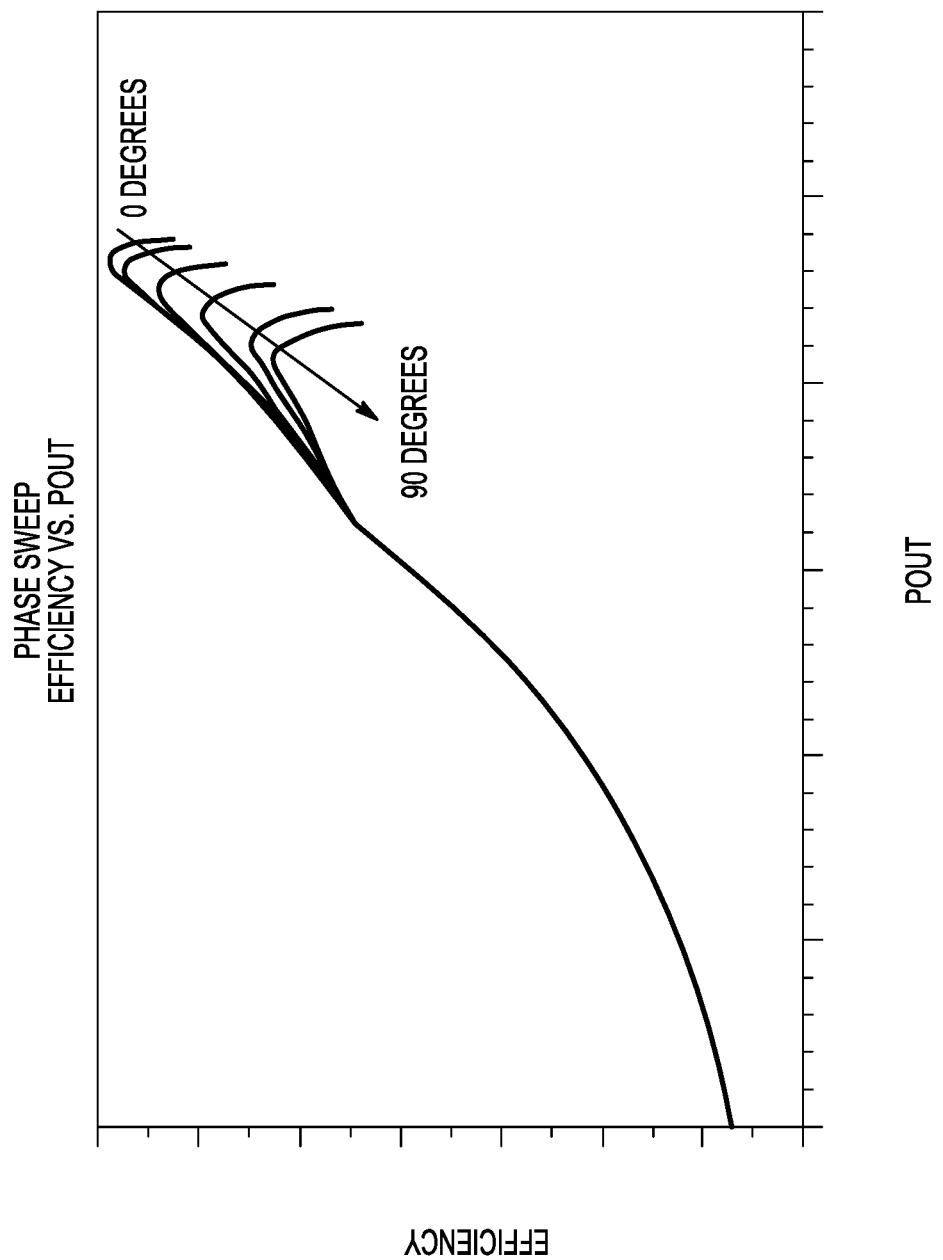
FIG. 11 illustrates a plot of efficiency vs output power for different phase values for the embodiment of FIG. 6.

FIGS. 10 and 11 show how gain and efficiency change by sweeping various phase values for variable phase shifter 90. FIG. 10 illustrates a plot of gain vs output power POUT for different phase values for the embodiment of FIG. 6 from about 0 degrees to about 90 degrees. Gain is plotted on the vertical axis versus output power POUT on the horizontal axis. FIG. 11 illustrates a plot of efficiency vs output power POUT for different phase values for the embodiment of FIG. 6 from about 0 degrees to about 90 degrees.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one as or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An amplifier circuit, comprising:
   a first amplifier of a first type having an input for receiving a radio frequency input signal, and an output;
   a second amplifier of a second type having an input and an output; and
   a directional coupler having a first terminal coupled to the output of the first amplifier, a second terminal coupled to the input of the second amplifier, a third terminal coupled to the output of the second amplifier for providing a radio frequency output signal, and a fourth terminal coupled to ground through a resistive element, wherein the first type is different than the second type, and wherein the second amplifier turns when the first amplifier reaches saturation.

2. The amplifier circuit of claim 1, wherein the first type is characterized as being class AB and the second type is characterized as being claim C.

3. The amplifier circuit of claim 1, wherein the amplifier circuit is characterized as being a Doherty amplifier, the first amplifier is a carrier amplifier, and the second amplifier is a peaking amplifier.

4. The amplifier circuit of claim 1, further comprising a variable phase shifter and a variable attenuator coupled together in series between the second terminal of the directional coupler and the input of the second amplifier.

5. The amplifier circuit of claim 4, further comprising a controller to adjust the variable phase shifter and variable attenuator based on in phase and quadrature input signals, wherein the in phase and quadrature input signals are combined to generate the radio frequency input signal.

6. The amplifier circuit of claim 5, wherein the controller comprises:
   an absolute value circuit arranged to determine an amplitude of the in phase and quadrature input signals and providing an adjustment signal to control the variable attenuator; and
   a shaping circuit arranged to determine the phase of the in phase and quadrature input signals and controlling a phase shift of the variable phase shifter.

7. The amplifier circuit of claim 1, further comprising a third amplifier coupled between the second terminal of the directional coupler and the input of the second amplifier.

8. An amplifier circuit, comprising:
- a first amplifier of a first type having an input for receiving a radio frequency input signal, and an output;
- a variable phase shifter and a variable attenuator coupled together in series to the output terminal of the first amplifier;
- a second amplifier of a second type having an input coupled to the variable phase shifter and the variable attenuator, and an output for providing a radio frequency output signal, wherein the first type is different than the second type, and wherein the second amplifier turns when the first amplifier reaches saturation; and
- a phase shifter having an input coupled to the output of the first amplifier, and an output coupled to the output of the second amplifier.

9. The amplifier circuit of claim 8, further comprising a directional coupler having a first terminal coupled to the output of the first amplifier, a second terminal coupled to the input of the second amplifier, and a third terminal coupled to the output of the second amplifier.

10. The amplifier circuit of claim 8, wherein the first type is characterized as being class AB and the second type is characterized as being claim C.

11. The amplifier circuit of claim 8, wherein the amplifier circuit is characterized as being a Doherty amplifier, the first amplifier is a carrier amplifier, and the second amplifier is a peaking amplifier.

12. The amplifier circuit of claim 9, wherein the directional coupler further comprises a fourth terminal coupled to ground through a resistive element.

13. The amplifier circuit of claim 8, further comprising a controller to adjust the variable phase shifter and variable attenuator based on in phase and quadrature input signals, wherein the in phase and quadrature input signals are combined to generate the radio frequency input signal, the controller comprising:
- an absolute value circuit arranged to determine an amplitude of the in phase and quadrature input signals and providing an adjustment signal to control the variable attenuator; and
- a shaping circuit arranged to determine the phase of the in phase and quadrature input signals and controlling a phase shift of the variable phase shifter.

14. An amplifier circuit, comprising:
- a first amplifier of a first type having an input for receiving a radio frequency input signal, and an output;
- a second amplifier of a second type having an input, and an output for providing a radio frequency output signal;
- a directional coupler having a first terminal coupled to the output of the first amplifier, a second terminal coupled to the input of the second amplifier, and a third terminal coupled to the output of the second amplifier for providing a radio frequency output signal;
- a variable phase shifter and a variable attenuator coupled together in series between the second terminal of the directional coupler and the input of the second amplifier; and
- a controller to adjust the variable phase shifter and variable attenuator based on in-phase and quadrature input signals, wherein the in-phase and quadrature input signals are combined to generate the radio frequency input signal, the controller comprising:
    - an absolute value circuit arranged to determine an amplitude of the in phase and quadrature input signals and providing an adjustment signal to control the variable attenuator; and
    - a shaping circuit arranged to determine the phase of the in phase and quadrature input signals and controlling a phase shift of the variable phase shifter.

15. The amplifier circuit of claim 14, wherein the amplifier circuit is characterized as being a Doherty amplifier, the first amplifier is a carrier amplifier, and the second amplifier is a peaking amplifier.

16. The amplifier circuit of claim 14, wherein the directional coupler further comprises a fourth terminal coupled to ground through a resistive element.

* * * * *